(12) United States Patent
Tsuchiya et al.

(10) Patent No.: US 12,408,467 B2
(45) Date of Patent: Sep. 2, 2025

(54) OPTICAL MODULE

(71) Applicant: SONY GROUP CORPORATION, Tokyo (JP)

(72) Inventors: Noriko Tsuchiya, Tokyo (JP); Takahiro Tomaru, Tokyo (JP); Hideaki Okano, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 357 days.

(21) Appl. No.: 17/919,497

(22) PCT Filed: Apr. 14, 2021

(86) PCT No.: PCT/JP2021/015462
§ 371 (c)(1),
(2) Date: Oct. 17, 2022

(87) PCT Pub. No.: WO2021/220813
PCT Pub. Date: Nov. 4, 2021

(65) Prior Publication Data
US 2023/0155054 A1 May 18, 2023

(30) Foreign Application Priority Data
Apr. 28, 2020 (JP) ................................ 2020-079247

(51) Int. Cl.
*H10F 55/25* (2025.01)
*H01L 25/16* (2023.01)
(Continued)

(52) U.S. Cl.
CPC ........... *H10F 55/25* (2025.01); *H01L 25/167* (2013.01); *H10F 55/20* (2025.01); *H10F 77/334* (2025.01)

(58) Field of Classification Search
CPC ............. H01L 31/02164; H01L 31/167; H01L 25/167; H10F 55/25; H10F 77/334; H10F 55/20
See application file for complete search history.

(56) References Cited

U.S. PATENT DOCUMENTS

| | | | |
|---|---|---|---|
| 2013/0075595 A1* | 3/2013 | Ruh | ........................ G01S 17/04 250/221 |
| 2013/0153772 A1* | 6/2013 | Rossi | ..................... G01J 1/0411 250/353 |

(Continued)

FOREIGN PATENT DOCUMENTS

| | | |
|---|---|---|
| JP | 2015-509184 A | 3/2015 |
| JP | 2015-088518 A | 5/2015 |

(Continued)

OTHER PUBLICATIONS

International Search Report and Written Opinion of PCT Application No. PCT/JP2021/015462, issued on Jul. 6, 2021, 11 pages of ISRWO.

*Primary Examiner* — Jeff W Natalini
*Assistant Examiner* — Brandon C Fox
(74) *Attorney, Agent, or Firm* — CHIP LAW GROUP

(57) ABSTRACT

Provided is an optical module including a substrate, a light emitting element on the substrate, a light receiving element on the substrate, a first casing on the substrate and surrounds a periphery of the light emitting element, and a second casing on the substrate and surrounds a periphery of the light receiving element. Furthermore, the optical module includes a light emitting lens in the first casing on an optical axis of the light emitting element and a light receiving lens in the second casing on an optical axis of the light receiving element, in which a first diameter of one lens out of the light emitting lens and the light receiving lens in a first direction toward an optical axis of the other lens with reference to an (Continued)

optical axis of the one lens is shorter than a second diameter of the one lens in a second direction.

13 Claims, 8 Drawing Sheets

(51) Int. Cl.
  *H10F 55/20* (2025.01)
  *H10F 77/30* (2025.01)

(56) References Cited

U.S. PATENT DOCUMENTS

| | | | |
|---|---|---|---|
| 2013/0292705 A1* | 11/2013 | Makimura | H01L 31/035272 |
| | | | 257/81 |
| 2016/0126403 A1* | 5/2016 | Tu | H10F 55/255 |
| | | | 257/82 |
| 2019/0207051 A1* | 7/2019 | Utsumi | H01L 25/167 |
| 2020/0357838 A1* | 11/2020 | Fukuyama | G02B 13/0045 |
| 2021/0041534 A1* | 2/2021 | Egawa | G01S 7/4813 |
| 2021/0373132 A1* | 12/2021 | Etschmaier | H10F 55/255 |

FOREIGN PATENT DOCUMENTS

| | | |
|---|---|---|
| JP | 2017-216471 A | 12/2017 |
| KR | 10-2019-0010257 A | 1/2019 |
| WO | 2017/203953 A1 | 11/2017 |
| WO | 2019/207953 A1 | 10/2019 |

\* cited by examiner

OPTICAL MODULE

CROSS REFERENCE TO RELATED APPLICATIONS

This application is a U.S. National Phase of International Patent Application No. PCT/JP2021/015462 filed on Apr. 14, 2021, which claims priority benefit of Japanese Patent Application No. JP 2020-079247 filed in the Japan Patent Office on Apr. 28, 2020. Each of the above-referenced applications is hereby incorporated herein by reference in its entirety.

TECHNICAL FIELD

The present technology relates to an optical module and particularly to an optical module including a light emitting element and a light receiving element.

BACKGROUND ART

In the related art, an optoelectronic module in which a radiation member (light emitting element) and a detection member (light receiving element) that detects reflected light of light emitted from the radiation member are housed in one housing has been proposed (see Patent Document 1).

CITATION LIST

Patent Document

Patent Document 1: PCT International Application Publication No. 2015-509184

SUMMARY OF THE INVENTION

Problems to be Solved by the Invention

However, the light emitting side and the light receiving side are formed in the same housing in the optoelectronic module described in Patent Document 1, it is difficult to independently adjust the positions of the light emitting side and the light receiving side, and there is thus a limit in improving performance.

The present technology was made in view of such a circumstance and is for improving performance of an optical module including a light emitting element and a light receiving element.

Solutions to Problems

An optical module according to an aspect of the present technology includes: a substrate; a light emitting element that is disposed on the substrate; a light receiving element that is disposed on the substrate at a predetermined interval from the light emitting element; a first casing that is disposed on the substrate and surrounds a periphery of the light emitting element; a second casing that is disposed on the substrate and surrounds a periphery of the light receiving element; a light emitting lens that is housed in the first casing and is disposed on an optical axis of the light emitting element; and a light receiving lens that is housed in the second casing and is disposed on an optical axis of the light receiving element, in which a first diameter of one lens out of the light emitting lens and the light receiving lens in a first direction toward an optical axis of the other lens with reference to an optical axis of the one lens is shorter than a second diameter of the one lens in a second direction that is orthogonal to the first direction.

According to an aspect of the present technology, emitted light emitted from the light emitting element is emitted via the light emitting lens, and reflected light of the emitted light is incident on the light receiving element via the light receiving lens.

MODE FOR CARRYING OUT THE INVENTION

Hereinafter, modes for carrying out of the present technology will be described. The description will be given in the following order.

1. First Embodiment
2. Modification examples of first embodiment
3. Second Embodiment
4. Third Embodiment
5. Fourth Embodiment
6. Modification examples
7. Application examples
8. Others

1. First Embodiment

First, a first embodiment of the present technology will be described with reference to FIGS. 1 to 3.

<Configuration Example of Optical Module 1a>

Figure 1:
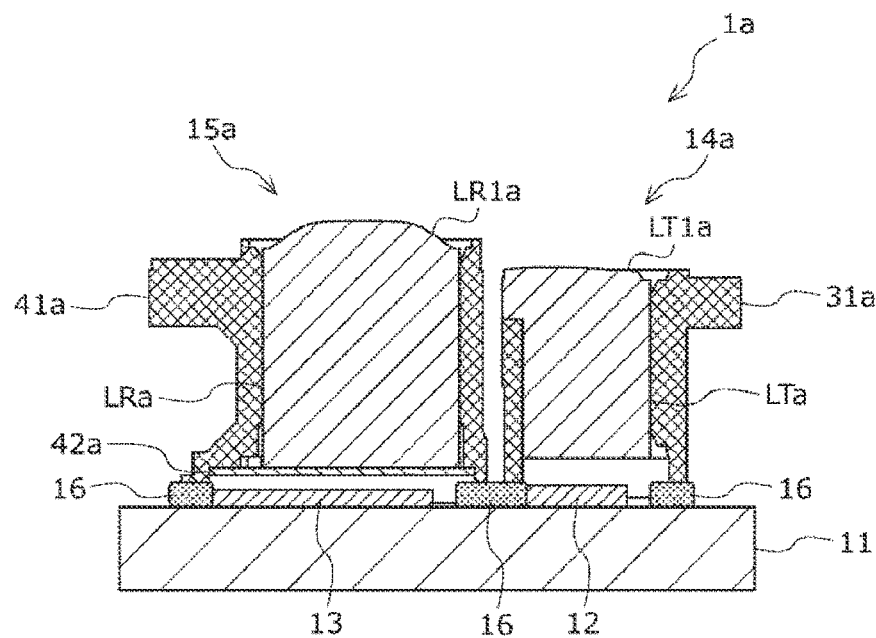
FIG. 1 is a sectional view schematically illustrating a first embodiment of an optical module to which the present technology is applied.

FIG. 1 is a sectional view schematically illustrating an optical module 1a to which the present technology is applied. FIG. 2 is a plan view schematically illustrating the optical module 1a to which the present technology is applied.

The optical module 1a is a module that emits emitted light and receives reflected light obtained by the emitted light being reflected by an object. The optical module 1a is used, for example, in a distance measuring sensor that measures a distance to an object. Hereinafter, a case where the optical module 1a is used for a distance measuring sensor will be described.

The optical module 1a includes a substrate 11, a light emitting element 12, a light receiving element 13, a light emitting module 14a, and a light receiving module 15a.

The light emitting element 12 and the light receiving element 13 are aligned and disposed at a predetermined interval on the substrate 11. The light emitting element 12 includes, for example, an element that emits light, such as a semiconductor laser (LD). The light receiving element 13 includes, for example, an element that converts incident light into an electric signal, such as an image sensor or a photodiode.

The light emitting module 14a is a module including a light emitting optical system that causes emitted light emitted from the light emitting element 12 to be emitted toward an object that is a target of distance measurement (hereinafter, referred to as a target). The light emitting module 14a includes a holder 31a and a light emitting lens group LTa.

The holder 31a is a cylindrical casing including resin or metal having a light shielding property and stores the light emitting lens group LTa. The holder 31a is disposed on the substrate 11 to surround the periphery of the light emitting element 12 and is bonded and fixed to the substrate 11 with a light shielding member 16 (for example, a resin having a light shielding property). As a result, a space between the lower end of the holder 31a and the substrate 11 is light-shielded, and the emitted light emitted from the light emitting element 12 is prevented from leaking to the outside of the light emitting module 14a from a portion other than the outermost (closest to the object side) lens LT1a in the light emitting lens group LTa. In particular, the light receiving element 13 is prevented from directly receiving the emitted light emitted from the light emitting element 12.

In addition, the position of the holder 31a is adjusted such that the optical axis of each lens in the light emitting lens group LTa coincides with the optical axis of the light emitting element 12.

Figure 3:
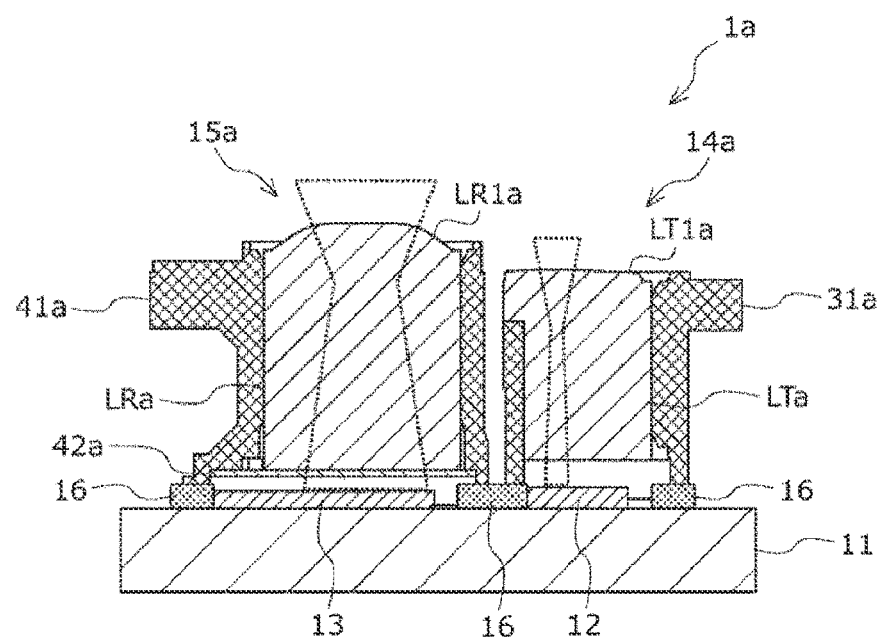
FIG. 3 is a diagram illustrating an example of an optical path of the optical module.

Then, the emitted light emitted from the light emitting element 12 is emitted from the light emitting module 14a toward the target via the light emitting lens group LTa as illustrated by the dotted line in FIG. 3.

The light receiving module 15a is a module that includes a light receiving optical system that receives reflected light obtained by the emitted light being reflected by the target and causes the reflected light to be incident on the light receiving element 13. The light receiving module 15a includes a holder 41a, a light receiving lens group LRa, and a bandpass filter (BPF) 42a.

The holder 41a is a cylindrical casing including a resin or metal having a light shielding property and houses the light receiving lens groups LRa and BPF 42a. The holder 41a is disposed on the substrate 11 to surround the periphery of the light receiving element 13 and is bonded and fixed to the substrate 11 with the light shielding member 16 similarly to the holder 31a. As a result, a space between the lower end of the holder 41a and the substrate 11 is light-shielded, and external light is prevented from being incident on the light receiving element 13 from a part other than the outermost (closest to the object side) lens LR1a in the light receiving lens group LRa.

Also, the position of the holder 41a is adjusted such that the optical axis of each lens in the light receiving lens group LRa coincides with the optical axis of the light receiving element 13.

Then, the reflected light obtained by the emitted light being reflected by the target is transmitted through the light receiving lens group LRa, a predetermined wavelength component is extracted by the BPF 42a, and the light is then incident on the light receiving surface of the light receiving element 13 as illustrated by the dotted line in FIG. 3.

Here, the holder 31a of the light emitting module 14a is independent from the holder 41a of the light receiving module 15a. Therefore, it is possible to independently perform adjustment of the position of the light emitting module 14a relative to the light emitting element 12 and adjustment of the position of the light receiving module 15a relative to the light receiving element 13.

As a result, it is possible to improve the positioning accuracy of the light emitting optical system relative to the light emitting element 12 and the positioning of the light receiving optical system relative to the light receiving element 13. In addition, it is possible to independently perform fine adjustment of the positions of the light emitting optical system and the light receiving optical system in accordance with variations and the like of performance of each of the optical elements including the light emitting element 12 and the light receiving element 13.

As a result, it is possible to improve optical performance of the optical module 1a. For example, it is possible to irradiate the target with more emitted light and to receive more reflected light, the amount of information that the optical module 1a can acquire increases, and distance measurement accuracy is improved.

Figure 2:
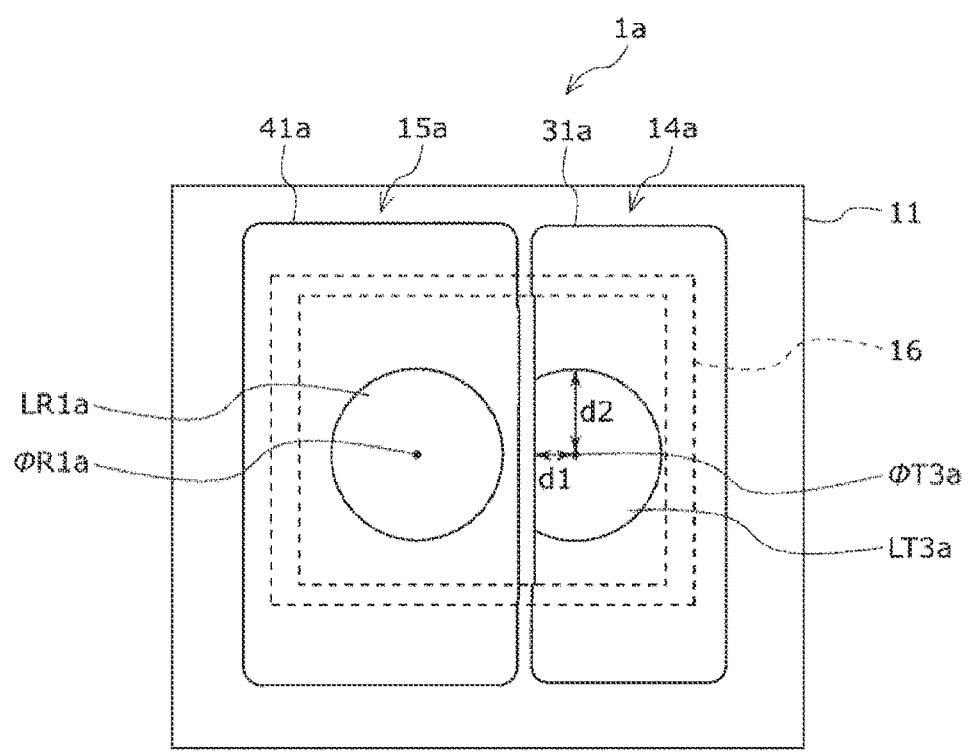
FIG. 2 is a plan view schematically illustrating the first embodiment of the optical module to which the present technology is applied.

Also, an optical axis $\varphi T1a$ of the lens LT1a in the light emitting lens group LTa is biased in the direction of an optical axis (an optical axis $\varphi R1a$ of the lens LR1a, for example) of the light receiving module 15a from the center of the lens LT1a as illustrated in FIG. 2. More specifically, the lens LT1a has a D-cut shape having a linear shape on a side on which the lens LT1a is adjacent to the light receiving module 15a (lens LR1a). Therefore, the diameter d1 of the lens LT1a in a first direction toward the optical axis $\varphi R1a$ of the lens LR1a with reference to the optical axis $\varphi T1a$ of the lens LT1a is shorter than the diameter d2 of the lens LT1a in a second direction that is orthogonal to the first direction.

Note that the diameter d1 is the shortest diameter (hereinafter, referred to as the shortest lens diameter) among the diameters of the lens LT1a with reference to the optical axis $\varphi T1a$ and is set to be equal to or greater than an effective diameter of the lens LT1a. The effective diameter of the lens LT1a is the maximum value among the diameters with reference to the optical axis $\varphi T1a$ of a region in which the emitted light emitted from the light emitting element 12 is assumed to pass through the lens LT1a. In other words, substantially all the emitted light emitted from the light emitting element 12 passes through the region within a range of the effective diameter around the optical axis $\varphi T1a$ of the lens LT1a at the center.

As described above, even if the lens LT1a is formed into the D-cut shape, optical performance of the light emitting module 14a can be assured by setting the shortest lens diameter to be equal to or greater than the effective diameter.

Also, although detailed illustration is omitted, the other lenses in the light emitting lens group LTa also have D-cut shapes having straight shapes on the side of the light receiving module 15a similarly to the lens LT1a. Moreover, the shortest lens diameter of each of the other lenses in the light emitting lens group LTa is also set to be equal or greater than the effective diameter.

Note that, since a region through which emitted light passes differs for each lens in the light emitting lens group LTa, the effective diameter of each lens is different.

In this manner, it is possible to shorten the distance (hereinafter, referred to as a base line length) between the optical axes of the light emitting module 14a and the light receiving module 15a even if a structure in which the holder 31a of the light emitting module 14a and the holder 41a of the light receiving module 15a are independent from each other is employed. Note that the baseline length is the distance between the optical axis φT1a of the lens LT1a and the optical axis φR1a of the lens LR1a in FIG. 2, for example.

As a result, it is possible to shorten the interval between the light emitting element 12 and the light receiving element 13 and to reduce the size of the optical module 1a. Also, it is possible to cause the incidence angle of the reflected light on the light receiving module 15a to be close to 0 degrees, for example, by the interval between the light emitting element 12 and the light receiving element 13 being shortened, and as a result, a distance measurement rule is improved.

In addition, leakage of the emitted light emitted from the light emitting element 12 from the part other than the lens LT1a to the outside of the light emitting module 14a is curbed by light-shielding the periphery of the light emitting element 12 with the holder 31a and the light shielding member 16. Moreover, incidence of external light on the light receiving element 13 from the part other than the lens LR1a is curbed by light-shielding the periphery of the light receiving element 13 with the holder 41a and the light shielding member 16.

As a result, the light receiving element 13 can receive more reflected light of the emitted light emitted from the light emitting element 12. In addition, receiving light other than the reflected light by the light receiving element 13 is curbed. As a result, it is possible to improve performance of the optical module 1a.

2. Modification Examples of First Embodiment

Next, modification examples of the first embodiment will be described with reference to FIGS. 4 to 6. In each modification example, the shape of an optical element of at least one optical system out of the light emitting optical system and the light receiving optical system is different from that in the first embodiment.

First Modification Example

First, a first modification example will be described with reference to FIG. 4. The first modification example is different from the first embodiment in that the optical element of the light receiving optical system has a D-cut shape.

Figure 4:
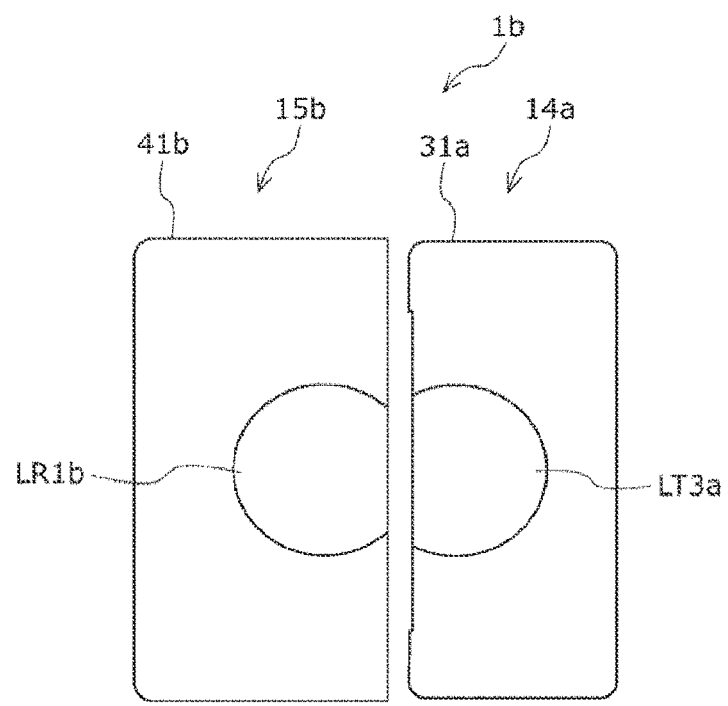
FIG. 4 is a plan view schematically illustrating a first modification example of the first embodiment of the optical module.

FIG. 4 is a plan view schematically illustrating an optical module 1b. Note that the same reference signs are applied to the parts corresponding to those of the optical module 1a in FIG. 2 in the drawing, and description thereof will be appropriately omitted. Also, illustration of the substrate 11 is omitted in FIG. 4.

The optical module 1b is different from the optical module 1a in that the optical module 1b includes a light receiving module 15b instead of the light receiving module 15a.

The light receiving module 15b is different from the light receiving module 15a in that the light receiving module 15b includes a holder 41b, a light receiving lens group LRb, and a BPF 42b instead of the holder 41a, the light receiving lens group LRa, and the BPF 42a. Note that illustration of the BPF 42b is omitted.

In this example, each lens in the light receiving lens group LRb has a D-cut shape having a linear shape on a side on which the lens is adjacent to the light emitting module 14a (light emitting lens group LTa) similarly to each lens in the light emitting lens group LTa.

Moreover, the shortest lens diameter of each lens in the light receiving lens group LRb is set to be equal to or greater than its effective diameter.

Furthermore, the holder 41b has a shape that is different from that of the holder 41a in accordance with a difference in shapes of optical elements to be housed.

In this manner, it is possible to further shorten the baseline length and to further reduce the size of the optical module 1b by forming the optical element of the light receiving optical system into a D-cut shape as well. In addition, it is possible to cause the incidence angle of the reflected light on the light receiving module 15b to be closer to 0 degrees, and as a result, distance measurement accuracy is improved.

Second Modification Example

Next, a second modification example will be described with reference to FIG. 5. The second modification example is different from the first embodiment in that the optical element of the light emitting optical system has an I-cut shape.

Figure 5:
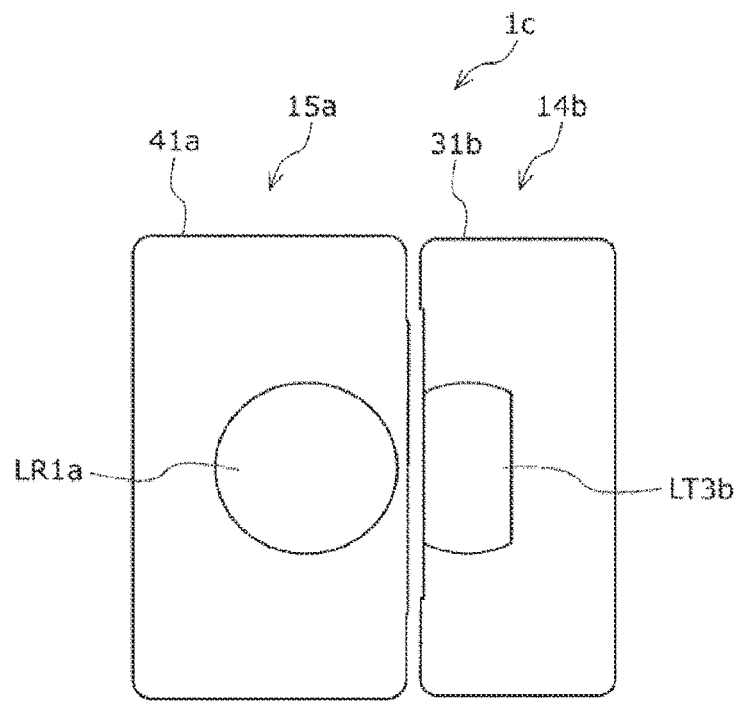
FIG. 5 is a plan view schematically illustrating a second modification example of the first embodiment of the optical module.

FIG. 5 is a plan view schematically illustrating an optical module 1c. Note that the same reference signs are applied to the parts corresponding to those of the optical module 1a in FIG. 2 in the drawing, and description thereof will be appropriately omitted. Also, illustration of the substrate 11 is omitted in FIG. 5.

The optical module 1c is different from the optical module 1a in that the optical module 1c includes a light emitting module 14b instead of the light emitting module 14a.

The light emitting module 14b is different from the light emitting module 14a in that the light emitting module 14b includes a holder 31b and a light emitting lens group LTb instead of the holder 31a and the light emitting lens group LTa.

In this example, each lens in the light emitting lens group LTb has an I-cut shape. In other words, each lens in the light emitting lens group LTb has a linear shape not only on the side on which the lens is adjacent to the light receiving module 15a (light receiving lens group LRa) but also on the side opposite thereto.

Moreover, the shortest lens diameter of each lens in the light emitting lens group LTb is set to be equal to or greater than its effective diameter.

Furthermore, the holder 31b has a shape that is different from that of the holder 31a in accordance with a difference in shapes of optical elements to be housed.

In this manner, it is possible to further reduce the size of the light emitting module 14b and to further reduce the size of the optical module 1c by forming the optical element of the light emitting optical system into an I-cut shape.

Third Modification Example

Next, a third modification example will be described with reference to FIG. 6. The third modification example is different from the first embodiment in the shapes of the optical elements of the light receiving optical system and the light emitting optical system.

Figure 6:
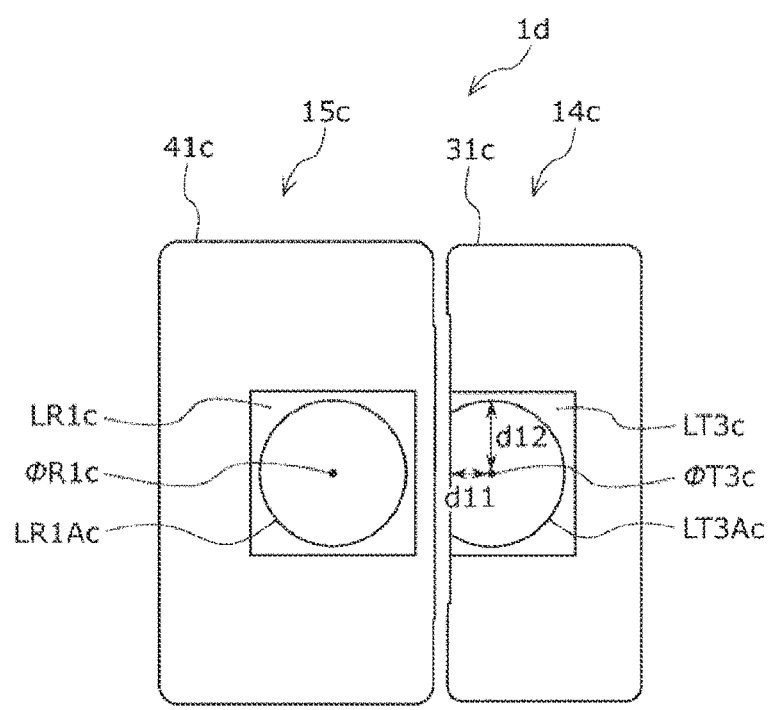
FIG. 6 is a plan view schematically illustrating a third modification example of the first embodiment of the optical module.

FIG. 6 is a plan view schematically illustrating an optical module 1d. Note that the same reference signs are applied to the parts corresponding to those of the optical module 1a in FIG. 2 in the drawing, and description thereof will be appropriately omitted. Also, illustration of the substrate 11 is omitted in FIG. 6.

The optical module 1d is different from the optical module 1a in that the optical module 1d includes a light emitting module 14c and a light receiving module 15c instead of the light emitting module 14a and the light receiving module 15a.

The light emitting module 14c is different from the light emitting module 14a in that the light emitting module 14c includes a holder 31c and a light emitting lens group LTc instead of the holder 31a and the light emitting lens group LTa.

The light receiving module 15c is different from the light receiving module 15a in that the light receiving module 15c includes a holder 41c, a light receiving lens group LRc, and a BPF 42c instead of the holder 41a, the light receiving lens group LRa, and the BPF 42a. Note that illustration of the BPF 42c is omitted.

In this example, the outer periphery of each of the lenses in the light emitting lens group LTc and the light receiving lens group LRc has a rectangular shape.

Also, a lens section LT1Ac that has a D-cut shape having a linear shape on the side of the light receiving module 15c similarly to the lens LT1a in FIG. 2 and substantially functions as a lens is formed at the outermost (closest to the object side) lens LT1c in the light emitting lens group LTc. Furthermore, the diameter d11 of the lens LT1a in a first direction toward an optical axis φR1c of the outermost (closest to the object side) lens LR1c in the light receiving lens group LRc with reference to an optical axis φT1c of the lens LT1a is shorter than the diameter d12 of the lens LT1c in a second direction that is orthogonal to the first direction. Also, the diameter d11 is set to be equal to or greater than the effective diameter of the lens LT1a.

Furthermore, although illustration is omitted, the outer peripheries of the other lenses in the light emitting lens group LTc have rectangular shapes similarly to the lens LT1c, and also, lens portions with D-cut shapes having linear shapes on the side of the light receiving module 15c are formed. Furthermore, each of the shortest lens diameters of the other lenses in the light emitting lens group LTc is also set to be equal or greater than the effective diameter.

A circular lens section LR1Ac that substantially functions as a lens is formed at the lens LR1c. The optical axis φR1c of the lens LR1c coincides with the center of the lens LR1c.

Also, the outer peripheries of the other lenses in the light receiving lens group LRc also have rectangular shapes similarly to the lens LR1c and the optical axis coincides with the center, although illustration is omitted.

Furthermore, the holder 31c has a shape that is different from that of the holder 31a in accordance with a difference in shapes of optical elements to be housed. The holder 41c has a shape that is different from the shape of the holder 41a due to a difference in shapes of optical elements to be housed.

In this manner, it is possible to shorten the baseline length of the optical module 1d even if a structure in which the holder 31c of the light emitting module 14c is independent from the holder 41c of the light receiving module 15d is employed similarly to the optical module 1a.

3. Second Embodiment

Next, a second embodiment of the present technology will be described with reference to FIG. 7.

Figure 7:
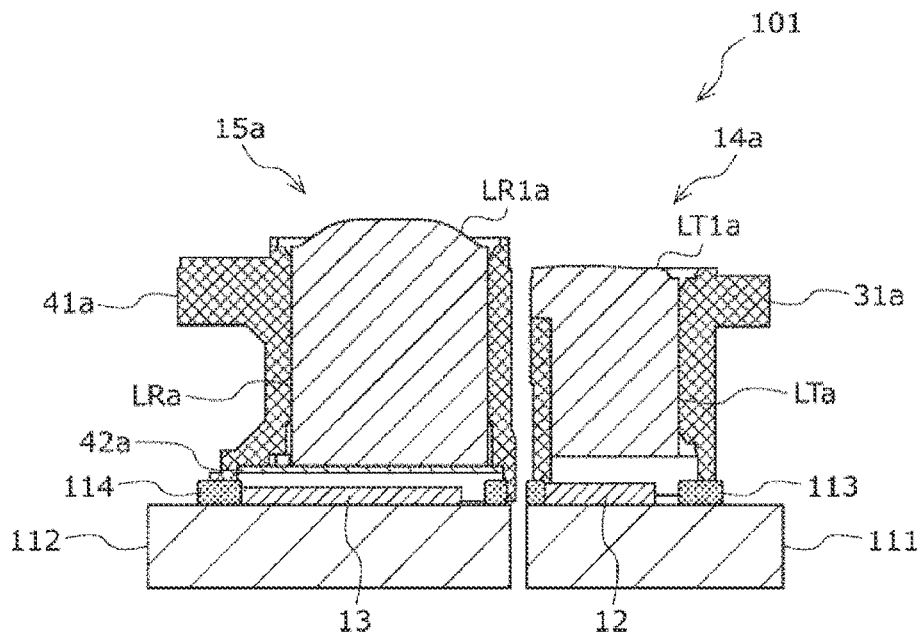
FIG. 7 is a sectional view schematically illustrating a second embodiment of an optical module to which the present technology is applied.

FIG. 7 is a sectional view schematically illustrating an optical module 101 to which the present technology is applied. Note that the same reference signs are applied to the parts corresponding to those of the optical module 1a in FIG. 1 in the drawing, and the description thereof will be appropriately omitted.

The optical module 101 is different from the optical module 1a in that the optical module 101 includes a substrate 111 and a substrate 112 instead of the substrate 11. In other words, the optical module 101 has substrates split on the light emitting side and the light receiving side.

Specifically, the light emitting element 12 and the light emitting module 14a are provided on the substrate 111. The holder 31a of the light emitting module 14a is disposed on the substrate 111 to cover the periphery of the light emitting element 12 and is bonded and fixed to the substrate 111 with a light shielding member 113 (for example, a resin having a light shielding property).

The light receiving element 13 and the light receiving module 15a are provided on the substrate 112. The holder 41a of the light receiving module 15a is disposed on the substrate 112 to cover the periphery of the light receiving element 13 and is bonded and fixed to the substrate 112 with a light shielding member 114 (for example, a resin having a light shielding property).

In this manner, it is possible to enable the light emitting side and the light receiving side to be separated while maintaining the baseline length to be short. As a result, it is possible to easily change the combination of the module on the light emitting side and the module on the light receiving side, for example.

4. Third Embodiment

Next, a third embodiment of the present technology will be described with reference to FIG. 8.

Figure 8:
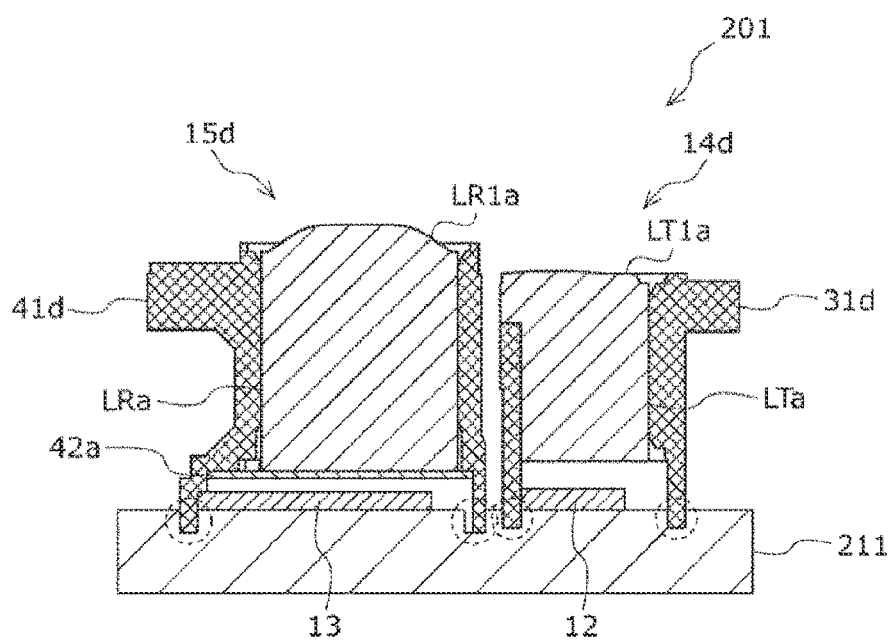
FIG. 8 is a sectional view schematically illustrating a third embodiment of an optical module to which the present technology is applied.

FIG. 8 is a sectional view schematically illustrating an optical module 201 to which the present technology is applied. Note that the same reference signs are applied to the parts corresponding to those of the optical module 1a in FIG. 1 in the drawing, and the description thereof will be appropriately omitted.

The optical module 201 is different from the optical module 1a in that the optical module 201 includes a substrate 211, a light emitting module 14d, and a light receiving module 15d instead of the substrate 11, the light emitting module 14a, and the light receiving module 15a.

The light emitting module 14d includes a light emitting optical system with a similar configuration and is different in that the light emitting module 14d includes a holder 31d instead of the holder 31a, as compared with the light emitting module 14a. The light receiving module 15d includes a light receiving optical system with a similar configuration and is different in that the light receiving module 15d includes a holder 41d instead of the holder 41a, as compared with the light receiving module 15a.

The holder 31d is different from the holder 31a in that the lower end extends and is inserted into the substrate 211 as illustrated by the part surrounded by the dotted-line circle in the drawing. As a result, the holder 31d is fixed to the substrate 211, and the periphery of the light emitting element 12 is light-shielded without using the light shielding member 16.

The holder 41d is different from the holder 41a in that the lower end extends and is inserted into the substrate 211 as illustrated by the part surrounded by the dotted-line circle in the drawing. Therefore, the periphery of the light receiving element 13 is light-shielded without using the light shielding member 16.

5. Fourth Embodiment

Next, a fourth embodiment of the present technology will be described with reference to FIGS. 9 and 10.

Figure 9:
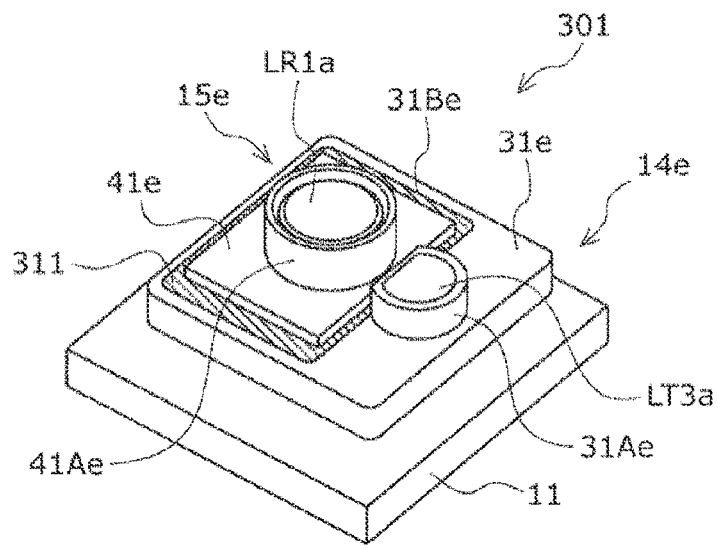
FIG. 9 is a perspective view schematically illustrating a fourth embodiment of an optical module to which the present technology is applied.

FIG. 9 is a sectional view schematically illustrating an optical module 301 to which the present technology is applied. FIG. 10 is a perspective view schematically illustrating the optical module 301 to which the present technology is applied. Note that the same reference signs are applied to the parts corresponding to those of the optical module 1a in FIG. 2 in the drawing, and description thereof will be appropriately omitted.

The optical module 301 is different from the optical module 1a in that the optical module 301 includes a light emitting module 14e and a light receiving module 15e instead of the light emitting module 14a and the light receiving module 15a.

The light emitting module 14e includes a light emitting optical system with a similar configuration and is different in that the light emitting module 14e includes a holder 31e instead of the holder 31a, as compared with the light emitting module 14a. The light receiving module 15e includes a light receiving optical system with a similar configuration and is different in that the light receiving module 15e includes a holder 41e instead of the holder 41a, as compared with the light receiving module 15a.

The outer periphery of the holder 31e has a rectangular shape, a housing section 31Ae for housing the light emitting optical system is formed, and also, a rectangular opening portion 31Be into which the holder 41a is inserted is formed beside the housing section 31Ae. The holder 31e is fixed to the substrate 11 with a light shielding member that is similar to the light shielding member 16 in FIG. 1 after the position is adjusted in accordance with the position of the light emitting element 12 (not illustrated) on the substrate 11.

A housing section 41Ae that houses the light receiving optical system is formed in the holder 41e. Also, the holder 41e is inserted into the opening portion 31Be of the holder 31e. As a result, the relative positions of the light emitting optical system inside the holder 31e and the light receiving optical system inside the holder 41e are substantially similar to those in the optical module 1a.

Also, the inner periphery of the opening portion 31Be is lightly larger than the outer periphery of the holder 41e. Therefore, a clearance is formed between the outer periphery of the holder 41e and the inner periphery of the opening portion 31Be when the holder 41e is inserted into the opening portion 31Be, and the position of the holder 41e in the horizontal direction can be adjusted. Then, the holder 41e is bonded and fixed to the inside of the opening portion 31Be by the clearance between the opening portion 31Be and the holder 41e being filled with a light shielding member 311 (for example, a resin having a light shielding property) after the position is adjusted in accordance with the position of the light receiving element 13.

In this manner, it is possible to independently adjust the positions of the holder 31e and the holder 41e in the optical module 301 as well.

Note that the fixation may be achieved by inserting the holder 31e into the substrate 11 as in the optical module 201 in FIG. 8, for example.

6. Modification Examples

Hereinafter, modification examples of the embodiments of the present technology described above will be described.

The present technology can also be applied to an optical module used for applications other than the distance measuring sensor as long as the optical module includes a light receiving element and a light emitting element.

For example, the configurations of the optical elements in the light emitting optical system and the light receiving optical system, for example, the number and the combination of lenses, the combination of optical elements other than lenses, and the like can be changed as needed.

For example, the modification examples illustrated in FIGS. 4 to 6 can be combined as much as possible.

For example, the shape of one optical element out of the light emitting optical system and the light receiving optical system can be a D-cut shape, and the shape of the other optical element can be an I-cut shape. For example, the shapes of the optical elements of both the light emitting optical system and the light receiving optical system can be I-cut shapes. For example, the lens section in the light receiving optical system in the optical module 1d in FIG. 6 may also be formed into a D-cut shape similarly to the light emitting optical system.

For example, only the holder 41a may be fixed to the substrate 11 with the light shielding member 16 in the optical module 1a in FIG. 1.

For example, only the holder 41a may be fixed to the substrate 11 with the light shielding member in the optical module 101 in FIG. 7.

For example, the substrates may be split for the light emitting optical system and the light receiving optical system in the optical module 201 in FIG. 8 similarly to the optical module 101 in FIG. 7.

Figure 10:
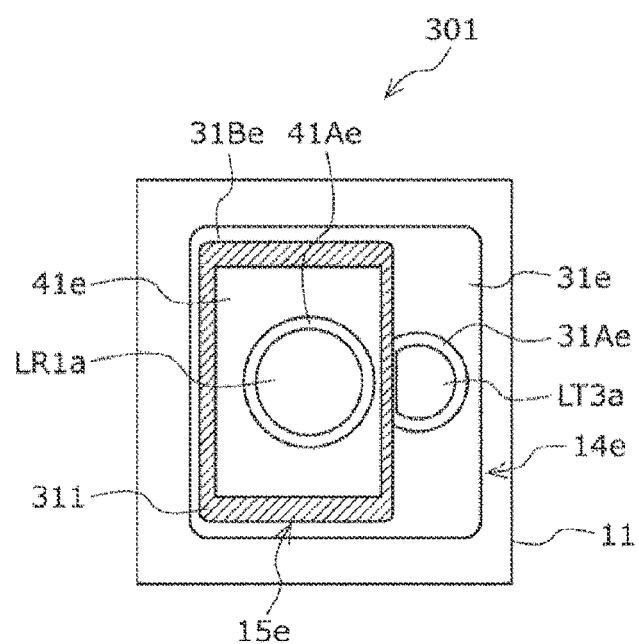
FIG. 10 is a sectional view schematically illustrating a fourth embodiment of an optical module to which the present technology is applied.

For example, a casing of the light emitting optical system may be inserted into an opening portion of a casing of the light receiving optical system in the optical module 301 in FIGS. 9 and 10.

Also, the wavelength of the emitted light is not particularly limited in the present technology.

7. Application Examples

The technology according to the present disclosure (present technology) can be applied to various products.
<Examples of Application to In-Vivo Information Acquisition System>

For example, the technology according to the present disclosure may be applied to an endoscopic surgical system.

Figure 11:
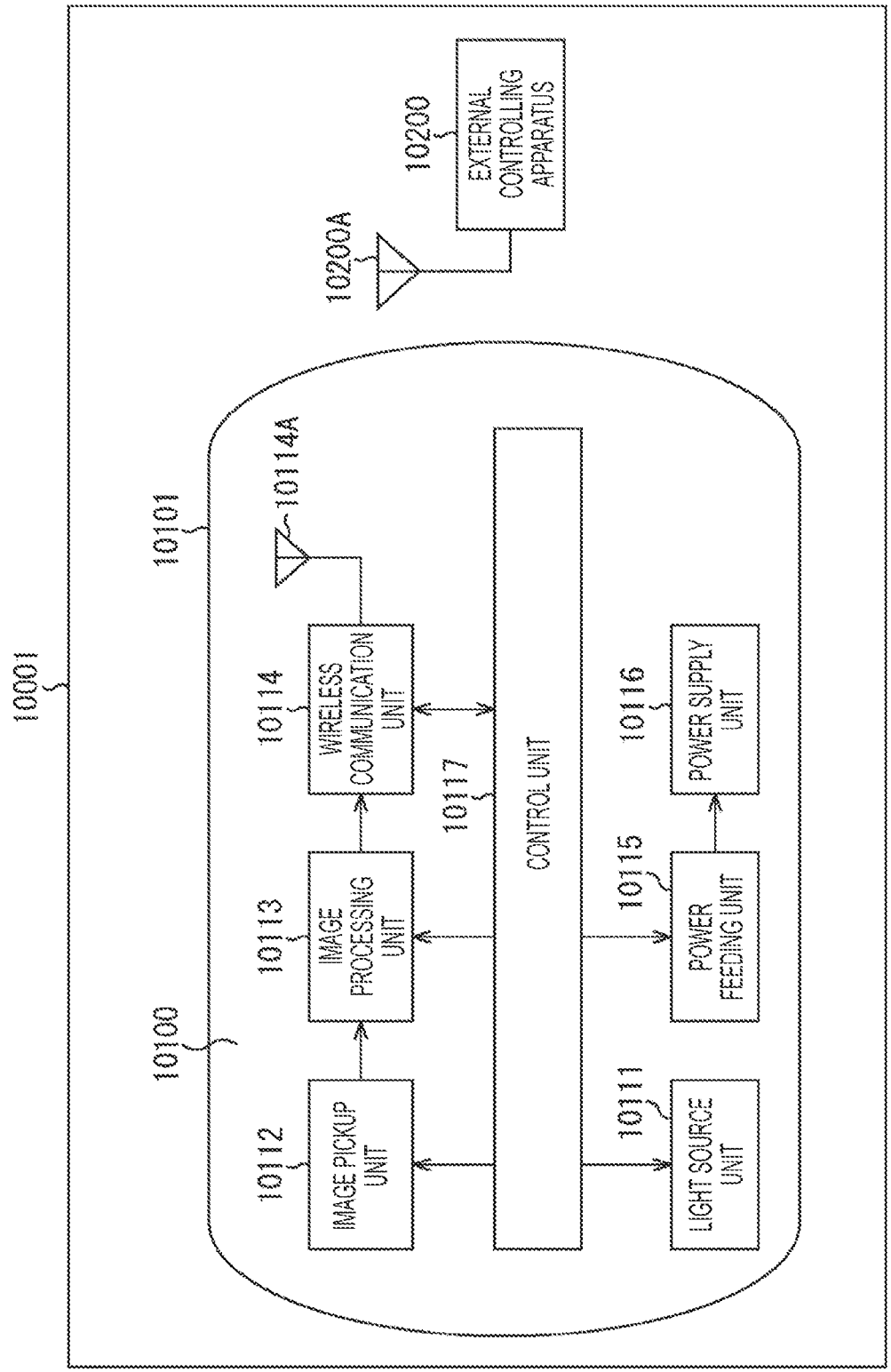
FIG. 11 is a block diagram illustrating an example of a schematic configuration of an in-vivo information acquisition system.

FIG. 11 is a block diagram illustrating an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 11, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114, and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure can be applied has been described above. The technology according to the present disclosure can be applied to the image pickup unit 10112 among the configurations described above. Specifically, the present invention can be applied to a distance measuring sensor used for focus control of the image pickup unit 10112, for example. As a result, it is possible to further reduce the size of the capsule type endoscope 10100, for example.

<Examples of Application to Mobile Body>

For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, or a robot.

Figure 12:
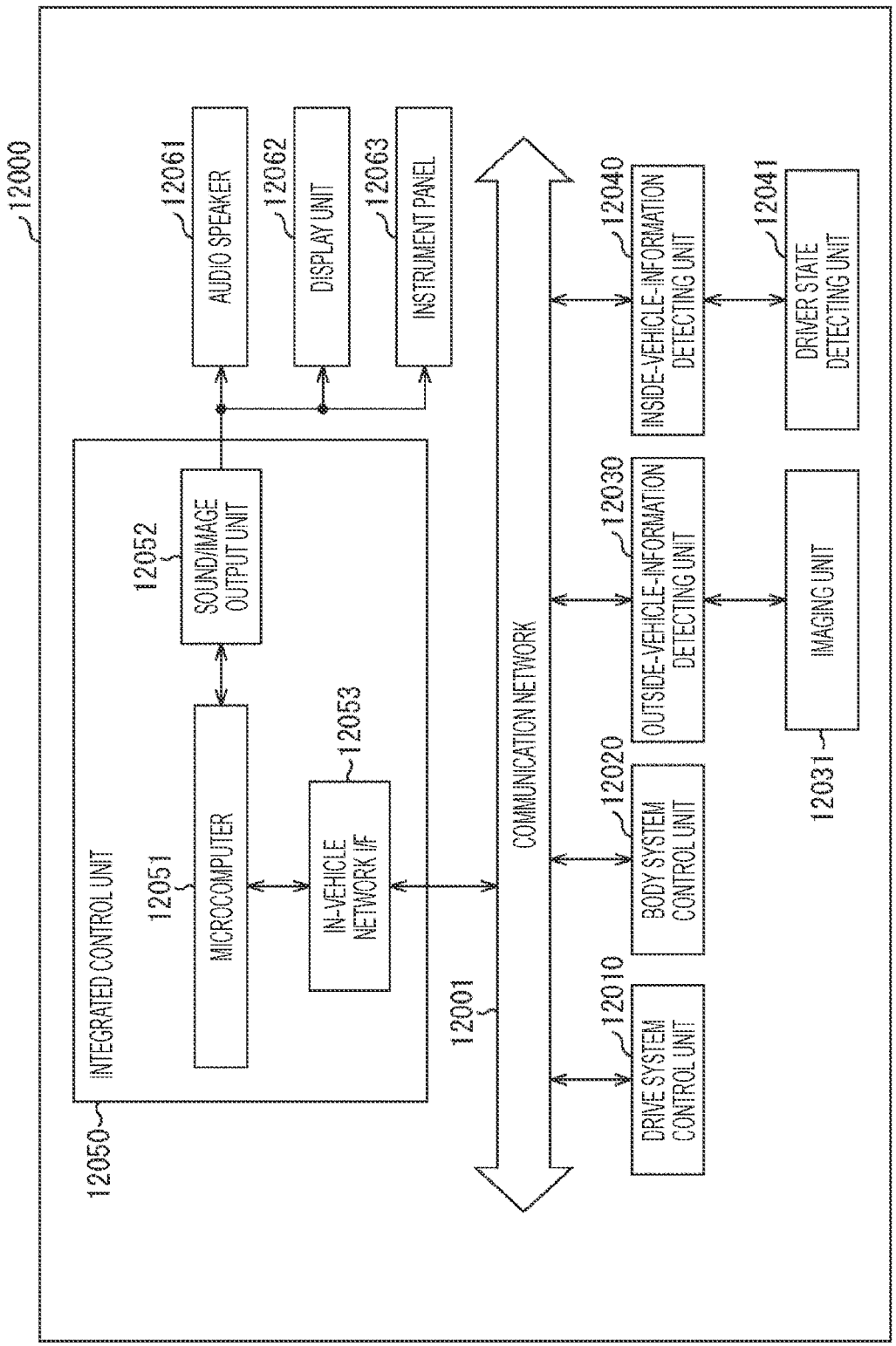
FIG. 12 is a block diagram illustrating an example of a schematic configuration of a vehicle control system.

FIG. 12 is a block diagram illustrating a schematic configuration example of a vehicle control system as an example of a mobile body control system to which the technology according to the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

Figure 13:
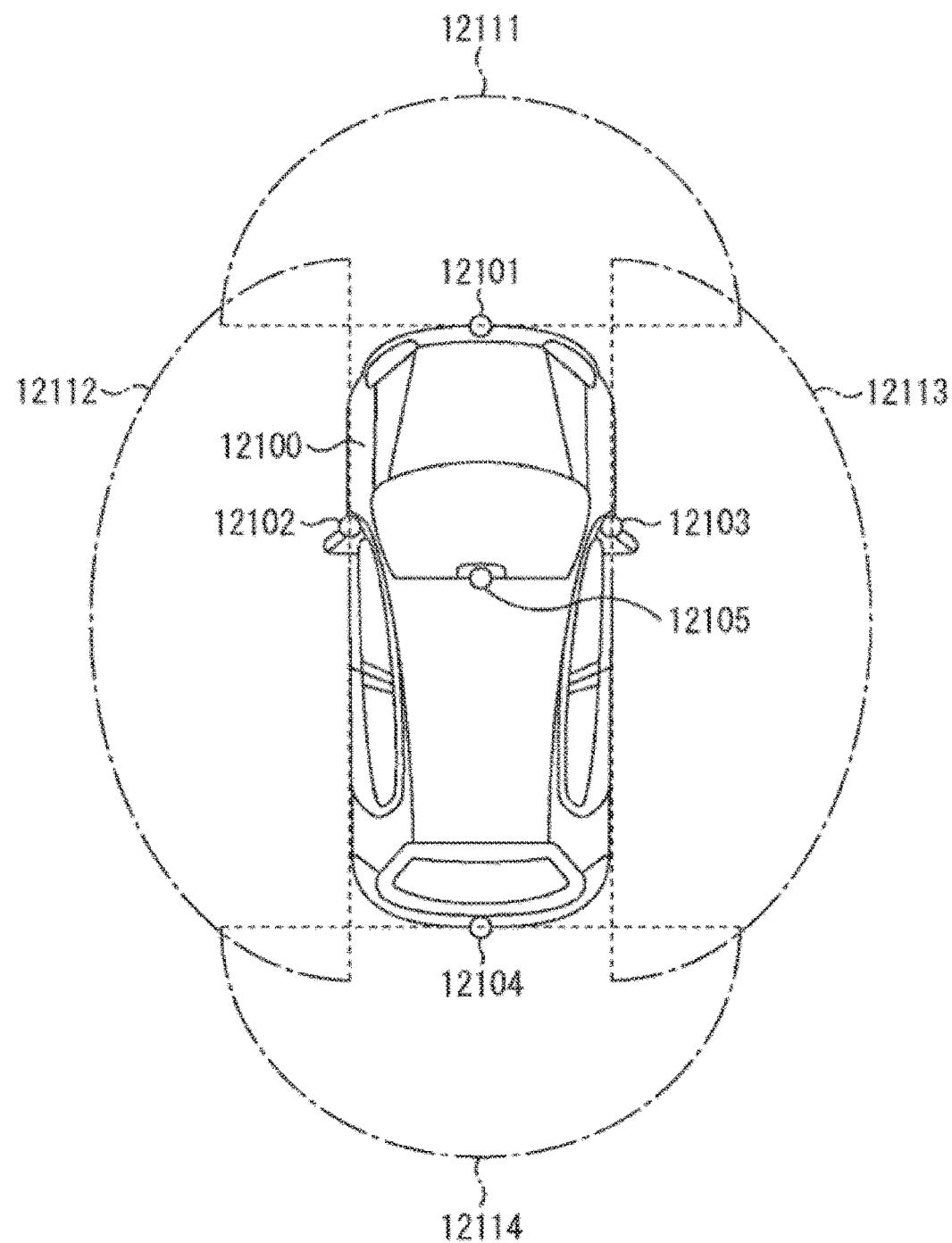
FIG. 13 is an explanatory diagram illustrating an example of installation positions of an outside-vehicle information detecting section and an imaging section.

FIG. 13 is a diagram illustrating an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 13 illustrates an example of image capturing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to a distance measuring sensor, an object sensor, and the like provided in a sensor section (not illustrated) that can be connected to the outside-vehicle information detecting unit 12030 among the configurations described above. As a result, it is possible to further reduce the size of the sensor section, for example.

8. Others

The embodiments of the present technology are not limited to the aforementioned embodiments, and various modifications can be made without departing from the gist of the present technology.

<Combination Examples of Configuration>

The present technology can also have the following configurations.

(1) An optical module including:
a substrate;
a light emitting element that is disposed on the substrate;
a light receiving element that is disposed on the substrate at a predetermined interval from the light emitting element;
a first casing that is disposed on the substrate and surrounds a periphery of the light emitting element;
a second casing that is disposed on the substrate and surrounds a periphery of the light receiving element;

a light emitting lens that is housed in the first casing and is disposed on an optical axis of the light emitting element; and a light receiving lens that is housed in the second casing and is disposed on an optical axis of the light receiving element, in which a first diameter of one lens out of the light emitting lens and the light receiving lens in a first direction toward an optical axis of another lens with reference to an optical axis of the one lens is shorter than a second diameter of the one lens in a second direction that is orthogonal to the first direction.

(2)

The optical module according to (1) described above, in which the first casing is fixed to the substrate with a member having a light shielding property.

(3)

The optical module according (2) described above, in which the first casing is further fixed to the substrate with a member having a light shielding property.

(4)

The optical module according to (1) described above, in which the first casing is inserted into the substrate.

(5)

The optical module according to (4) described above, in which the second casing is further inserted into the substrate.

(6)

The optical module according to any one of (1) to (5) described above, in which the substrate on which the light emitting element and the first casing are disposed and the substrate on which the light receiving element and the second casing are disposed are different from each other.

(7)

The optical module according to any one of (1) to (5) described above, in which an opening portion of one casing out of the first casing and the second casing allows another casing to be inserted thereinto with a clearance between an outer periphery of the another casing and an inner periphery of the opening portion.

(8)

The optical module according to (7) described above, in which the another casing is fixed to the opening portion with a member having a light shielding property, with which the clearance is filled.

(9)

The optical module according to any one of (1) to (8) described above, in which the optical axis of the one lens is biased in the first direction from a center of the one lens.

(10)

The optical module according to (9) described above, in which the one lens has a D-cut shape that has a linear shape on a side on which the one lens is adjacent to the another lens.

(11)

The optical module according to (9) described above, in which an outer periphery of the one lens has a rectangular shape.

(12)

The optical module according to any one of (1) to (8) described above, in which the one lens has an I-cut shape that has linear shapes on a side on which the one lens is adjacent to the another lens and a side opposite to the side on which the one lens is adjacent to the another lens.

(13)

The optical module according to any one of (1) to (12) described above, in which a diameter of the another lens in a third direction toward the optical axis of the one lens with reference to the optical axis of the another lens is shorter than a diameter of the another lens in a fourth direction that is orthogonal to the third direction.

(14)

The optical module according to any one of (1) to (13) described above, in which the first diameter is equal to or greater than an effective diameter of the one lens.

Note that the effects described in the present specification are illustrated just as examples and are not limited thereto and there may be other effects.

REFERENCE SIGNS LIST

1$a$ to 1$d$ Optical module
11 Substrate
12 Light emitting element
13 Light receiving element
14$a$ to 14$e$ Light emitting module
15$a$ to 15$e$ Light receiving module
16 Light shielding member
31$a$ to 31$e$ Holder
41$a$ to 41$e$ Holder
42$a$ to 42$c$ Bandpass filter
101 Optical module
111, 112 Substrate
113, 114 Light shielding member
201 Optical module
211 Substrate
301 Optical module
LTa to LTc Light emitting lens group
LT1$a$, LT1$c$ Lens
LRa to LRc Light receiving lens group
LR1$a$, LR1$c$ Lens

The invention claimed is:

1. An optical module, comprising:
a substrate;
a light emitting element on the substrate;
a light receiving element on the substrate at a specific interval from the light emitting element;
a first casing on the substrate, wherein the first casing surrounds a periphery of the light emitting element;
a second casing on the substrate, wherein the second casing surrounds a periphery of the light receiving element;
a light emitting lens in the first casing, wherein the light emitting lens is on a first optical axis of the light emitting element; and
a light receiving lens in the second casing, wherein the light receiving lens is on a second optical axis of the light receiving element, wherein
a first diameter of one lens out of the light emitting lens or the light receiving lens in a first direction is shorter than a second diameter of the one lens in a second direction,
the second direction is orthogonal to the first direction,
the first diameter is toward a third optical axis of another lens of the light emitting lens or the light receiving lens, with reference to a fourth optical axis of the one lens, and the first diameter is equal to or greater than an effective diameter of the one lens.

2. The optical module according to claim 1, wherein the second casing is fixed to the substrate with a first member having a light shielding property.

3. The optical module according to claim 2, wherein the first casing is further fixed to the substrate with a second member having a light shielding property.

4. The optical module according to claim 1, wherein the second casing is inserted into the substrate.

5. The optical module according to claim 4, wherein the first casing is further inserted into the substrate.

6. The optical module according to claim 1, wherein
the substrate includes a first substrate and a second substrate,
the light emitting element and the first casing are on the first substrate,
the light receiving element and the second casing are on the second substrate, and
the first substrate is different from the second substrate.

7. The optical module according to claim 1, wherein an opening portion of one casing out of the first casing or the second casing allows another casing, of the first casing or the second casing, to be inserted thereinto with a clearance between an outer periphery of the other casing and an inner periphery of the opening portion.

8. The optical module according to claim 7, wherein
the other casing is fixed to the opening portion with a member having a light shielding property, and
the clearance is filled with the member having the light shielding property.

9. The optical module according to claim 1, wherein the fourth optical axis of the one lens is biased in the first direction from a center of the one lens.

10. The optical module according to claim 9, wherein
the one lens has a D-cut shape, and
the D-cut shape has a linear shape on a side on which the one lens is adjacent to the other lens.

11. The optical module according to claim 9, wherein an outer periphery of the one lens has a rectangular shape.

12. The optical module according to claim 1, wherein
the one lens has an I-cut shape, and
the I-cut shape has linear shapes on a first side on which the one lens is adjacent to the other lens and a second side opposite to the first side.

13. The optical module according to claim 1, wherein
a third diameter of the other lens in a third direction is shorter than a fourth diameter of the other lens in a fourth direction,
the fourth direction is orthogonal to the third direction, and
the third diameter is toward the fourth optical axis of the one lens, with reference to the third optical axis of the other lens.

* * * * *